United States Patent
Das et al.

(10) Patent No.: US 10,935,620 B2
(45) Date of Patent: Mar. 2, 2021

(54) ON-CHIP RESONANCE DETECTION AND TRANSFER FUNCTION MAPPING OF RESISTIVE-INDUCTIVE-CAPACITIVE SENSORS

(71) Applicant: Cirrus Logic International Semiconductor Ltd., Edinburgh (GB)

(72) Inventors: Tejasvi Das, Austin, TX (US); Siddharth Maru, Austin, TX (US); Matthew Beardsworth, Austin, TX (US); Bruce E. Duewer, Round Rock, TX (US); Michael A. Kost, Cedar Park, TX (US)

(73) Assignee: Cirrus Logic, Inc., Austin, TX (US)

( * ) Notice: Subject to any disclaimer, the term of this patent is extended or adjusted under 35 U.S.C. 154(b) by 60 days.

(21) Appl. No.: 16/455,437

(22) Filed: Jun. 27, 2019

(65) Prior Publication Data
US 2020/0271745 A1    Aug. 27, 2020

Related U.S. Application Data

(60) Provisional application No. 62/810,696, filed on Feb. 26, 2019.

(51) Int. Cl.
*G01R 35/00* (2006.01)
*G01R 23/02* (2006.01)
(Continued)

(52) U.S. Cl.
CPC ........... *G01R 35/005* (2013.01); *G01R 23/02* (2013.01); *G01R 27/02* (2013.01); *G06F 3/0418* (2013.01)

(58) Field of Classification Search
CPC ...... G01R 35/005; G01R 23/02; G01R 27/02; G06F 3/0418
(Continued)

(56) References Cited

U.S. PATENT DOCUMENTS 4,888,554 A     12/1989  Hyde et al.
5,286,941 A *   2/1994   Bel ............................ H03L 5/02
                                                     219/121.36
(Continued)

FOREIGN PATENT DOCUMENTS

DE        4004450 A1      8/1991
DE    102015215330 A1     2/2017
(Continued)

OTHER PUBLICATIONS

International Search Report and Written Opinion of the International Searching Authority, International Application No. PCT/US2019/022518, dated May 24, 2019.
(Continued)

*Primary Examiner* — Christopher P McAndrew
(74) *Attorney, Agent, or Firm* — Jackson Walker L.L.P.

(57) ABSTRACT

A system may include a resistive-inductive-capacitive sensor, a driver configured to drive the resistive-inductive-capacitive sensor with a driving signal at a driving frequency, and a measurement circuit communicatively coupled to the resistive-inductive-capacitive sensor and configured to, during a calibration phase of the measurement circuit, measure phase and amplitude information associated with the resistive-inductive-capacitive sensor and based on the phase and amplitude information, determine at least one of a resonant frequency of the resistive-inductive-capacitive sensor and a transfer function of the resistive-inductive-capacitive sensor.

29 Claims, 4 Drawing Sheets

(51) Int. Cl.
*G01R 27/02* (2006.01)
*G06F 3/041* (2006.01)

(58) Field of Classification Search
USPC .......................................................... 324/609
See application file for complete search history.

(56) References Cited

U.S. PATENT DOCUMENTS

| | | | |
|---|---|---|---|
| 5,898,136 | A | 4/1999 | Katsurahira |
| 6,231,520 | B1 | 5/2001 | Maezawa |
| 6,380,923 | B1 | 4/2002 | Fukumoto et al. |
| 8,384,378 | B2 | 2/2013 | Feldkamp et al. |
| 8,421,446 | B2 | 4/2013 | Straubinger et al. |
| 9,707,502 | B1 | 7/2017 | Bonifas et al. |
| 10,642,435 | B2 | 5/2020 | Maru et al. |
| 2003/0038624 | A1* | 2/2003 | Hilliard ............... G08G 1/042 324/200 |
| 2005/0192727 | A1 | 9/2005 | Shostak et al. |
| 2005/0258826 | A1 | 11/2005 | Kano et al. |
| 2006/0025897 | A1 | 2/2006 | Shostak et al. |
| 2007/0198926 | A1 | 8/2007 | Joguet et al. |
| 2008/0150905 | A1 | 6/2008 | Grivna et al. |
| 2009/0058430 | A1 | 3/2009 | Zhu |
| 2009/0140728 | A1* | 6/2009 | Rollins ............... G01B 7/023 324/207.16 |
| 2009/0278685 | A1 | 11/2009 | Potyrailo et al. |
| 2010/0045360 | A1 | 2/2010 | Howard et al. |
| 2010/0153845 | A1 | 6/2010 | Gregorio et al. |
| 2010/0211902 | A1 | 8/2010 | Unsworth et al. |
| 2010/0231239 | A1 | 9/2010 | Tateishi et al. |
| 2010/0238121 | A1 | 9/2010 | Ely |
| 2010/0328249 | A1 | 12/2010 | Ningrat et al. |
| 2011/0005090 | A1 | 1/2011 | Lee et al. |
| 2011/0216311 | A1* | 9/2011 | Kachanov ............... G01N 21/39 356/213 |
| 2011/0267302 | A1 | 11/2011 | Fasshauer |
| 2011/0291821 | A1 | 12/2011 | Chung |
| 2011/0301876 | A1 | 12/2011 | Yamashita |
| 2013/0018489 | A1 | 1/2013 | Grunthaner et al. |
| 2013/0076374 | A1 | 3/2013 | Huang |
| 2013/0106756 | A1 | 5/2013 | Kono et al. |
| 2013/0106769 | A1 | 5/2013 | Bakken et al. |
| 2013/0269446 | A1 | 10/2013 | Fukushima et al. |
| 2014/0028327 | A1* | 1/2014 | Potyrailo ............ G01N 33/0073 324/601 |
| 2014/0225599 | A1* | 8/2014 | Hess ..................... G01R 23/02 324/207.15 |
| 2014/0267065 | A1 | 9/2014 | Levesque |
| 2015/0022174 | A1* | 1/2015 | Nikitin ................. H02M 3/157 323/282 |
| 2015/0077094 | A1 | 3/2015 | Baldwin et al. |
| 2015/0329199 | A1 | 11/2015 | Golborne et al. |
| 2016/0018940 | A1 | 1/2016 | Lo et al. |
| 2016/0048256 | A1 | 2/2016 | Day |
| 2016/0179243 | A1 | 6/2016 | Schwartz |
| 2016/0252403 | A1 | 9/2016 | Murakami |
| 2017/0077735 | A1 | 3/2017 | Leabman |
| 2017/0093222 | A1 | 3/2017 | Joye et al. |
| 2017/0147068 | A1 | 5/2017 | Yamazaki et al. |
| 2017/0168578 | A1 | 6/2017 | Tsukamoto et al. |
| 2017/0185173 | A1 | 6/2017 | Ito et al. |
| 2017/0187541 | A1 | 6/2017 | Sundaresan et al. |
| 2017/0237293 | A1 | 8/2017 | Faraone et al. |
| 2017/0328740 | A1 | 11/2017 | Widmer et al. |
| 2017/0371380 | A1 | 12/2017 | Oberhauser et al. |
| 2017/0371381 | A1 | 12/2017 | Liu |
| 2017/0371473 | A1 | 12/2017 | David et al. |
| 2018/0019722 | A1 | 1/2018 | Birkbeck |
| 2018/0055448 | A1* | 3/2018 | Karakaya ............ A61B 5/14539 |
| 2018/0088064 | A1 | 3/2018 | Potyrailo et al. |
| 2018/0135409 | A1 | 5/2018 | Wilson et al. |
| 2018/0182212 | A1 | 6/2018 | Li et al. |
| 2018/0183372 | A1 | 6/2018 | Li et al. |
| 2018/0195881 | A1 | 7/2018 | Acker |
| 2018/0221796 | A1 | 8/2018 | Bonifas et al. |
| 2018/0229161 | A1 | 8/2018 | Maki et al. |
| 2018/0231485 | A1 | 8/2018 | Potyrailo et al. |
| 2018/0260049 | A1 | 9/2018 | O'Lionaird et al. |
| 2018/0260050 | A1 | 9/2018 | Unseld et al. |
| 2018/0321748 | A1 | 11/2018 | Rao et al. |
| 2019/0179146 | A1 | 6/2019 | De Nardi |
| 2019/0235629 | A1 | 8/2019 | Hu et al. |
| 2019/0302161 | A1 | 10/2019 | You et al. |
| 2019/0302193 | A1 | 10/2019 | Maru et al. |
| 2019/0302890 | A1 | 10/2019 | Marijanovic et al. |
| 2019/0302922 | A1 | 10/2019 | Das et al. |
| 2019/0302923 | A1 | 10/2019 | Maru et al. |
| 2020/0064160 | A1 | 2/2020 | Maru et al. |
| 2020/0133455 | A1 | 4/2020 | Sepehr et al. |
| 2020/0177290 | A1 | 6/2020 | Reimer et al. |
| 2020/0191761 | A1 | 6/2020 | Potyrailo et al. |
| 2020/0271477 | A1 | 8/2020 | Kost et al. |
| 2020/0271706 | A1 | 8/2020 | Wardlaw et al. |
| 2020/0271745 | A1 | 8/2020 | Das et al. |
| 2020/0272301 | A1 | 8/2020 | Duewer et al. |
| 2020/0319237 | A1 | 10/2020 | Maru et al. |

FOREIGN PATENT DOCUMENTS

| | | |
|---|---|---|
| DE | 102015215331 A1 | 2/2017 |
| EP | 1697710 B1 | 4/2007 |
| EP | 2682843 A1 | 1/2014 |
| GB | 2573644 A | 11/2019 |
| JP | 2006246289 A | 9/2006 |
| WO | 00/33244 A2 | 6/2000 |
| WO | 2007068283 A1 | 6/2007 |
| WO | 2016032704 A1 | 3/2016 |

OTHER PUBLICATIONS

International Search Report and Written Opinion of the International Searching Authority, International Application No. PCT/US2019/022578, dated May 27, 2019.
International Search Report and Written Opinion of the International Searching Authority, International Application No. PCT/US2019/021838, dated May 27, 2019.
Combined Search and Examination Report under Sections 17 and 18(3), UKIPO, Application No. GB2001341.3, dated Jun. 29, 2020.
International Search Report and Written Opinion of the International Searching Authority, International Application No. PCT/US2019/045554, dated Oct. 17, 2019.
Combined Search and Examination Report, UKIPO, Application No. GB1904250.6, dated Sep. 10, 2019.

* cited by examiner

ON-CHIP RESONANCE DETECTION AND TRANSFER FUNCTION MAPPING OF RESISTIVE-INDUCTIVE-CAPACITIVE SENSORS

RELATED APPLICATIONS

The present disclosure claims priority to U.S. Provisional Patent Application Ser. No. 62/810,696, filed Feb. 26, 2019, which is incorporated by reference herein in its entirety.

The present disclosure relates to U.S. Provisional patent application Ser. No. 16/267,079, filed Feb. 4, 2019, U.S. Provisional Patent Application Ser. No. 62/649,857, filed Mar. 29, 2018, U.S. Provisional Patent Application Ser. No. 62/721,134, filed Aug. 22, 2018, and U.S. Provisional Patent Application Ser. No. 62/740,029, filed Oct. 2, 2018, all of which are incorporated by reference herein in their entireties.

FIELD OF DISCLOSURE

The present disclosure relates in general to electronic devices with user interfaces, (e.g., mobile devices, game controllers, instrument panels, etc.), and more particularly, resonant phase sensing of resistive-inductive-capacitive sensors for use in a system for mechanical button replacement in a mobile device, and/or other suitable applications.

BACKGROUND

Many traditional mobile devices (e.g., mobile phones, personal digital assistants, video game controllers, etc.) include mechanical buttons to allow for interaction between a user of a mobile device and the mobile device itself. However, such mechanical buttons are susceptible to aging, wear, and tear that may reduce the useful life of a mobile device and/or may require significant repair if malfunction occurs. Also, the presence of mechanical buttons may render it difficult to manufacture mobile devices that are waterproof. Accordingly, mobile device manufacturers are increasingly looking to equip mobile devices with virtual buttons that act as a human-machine interface allowing for interaction between a user of a mobile device and the mobile device itself. Similarly, mobile device manufacturers are increasingly looking to equip mobile devices with other virtual interface areas (e.g., a virtual slider, interface areas of a body of the mobile device other than a touch screen, etc.). Ideally, for best user experience, such virtual interface areas should look and feel to a user as if a mechanical button or other mechanical interface were present instead of a virtual button or virtual interface area.

Presently, linear resonant actuators (LRAs) and other vibrational actuators (e.g., rotational actuators, vibrating motors, etc.) are increasingly being used in mobile devices to generate vibrational feedback in response to user interaction with human-machine interfaces of such devices. Typically, a sensor (traditionally a force or pressure sensor) detects user interaction with the device (e.g., a finger press on a virtual button of the device) and in response thereto, the linear resonant actuator may vibrate to provide feedback to the user. For example, a linear resonant actuator may vibrate in response to user interaction with the human-machine interface to mimic to the user the feel of a mechanical button click.

However, there is a need in the industry for sensors to detect user interaction with a human-machine interface, wherein such sensors provide acceptable levels of sensor sensitivity, power consumption, and size. One type of sensor that may be utilized to detect user interaction with a human-machine interface is a resistive-inductive-capacitive sensor. Characteristics (e.g., resonance frequency, transfer function) of a resistive-inductive-capacitive sensor may vary due to manufacturing variances, temperature drift, component aging, changes in mechanical structures, presence of electromagnetic interference, and/or other causes. Accordingly, to ensure accurate and precise measurement using a resistive-inductive-capacitive sensor, it may be desirable to measure and/or detect such characteristics for the purpose of calibration, quality factor determination, and/or noise reduction.

SUMMARY

In accordance with the teachings of the present disclosure, the disadvantages and problems associated with determining characteristics in a resistive-inductive-capacitive sensor may be reduced or eliminated.

In accordance with embodiments of the present disclosure, a system may include a resistive-inductive-capacitive sensor, a driver configured to drive the resistive-inductive-capacitive sensor with a driving signal at a driving frequency, and a measurement circuit communicatively coupled to the resistive-inductive-capacitive sensor and configured to, during a calibration phase of the measurement circuit, measure phase and amplitude information associated with the resistive-inductive-capacitive sensor and based on the phase and amplitude information, determine at least one of a resonant frequency of the resistive-inductive-capacitive sensor and a transfer function of the resistive-inductive-capacitive sensor.

In accordance with these and other embodiments of the present disclosure, a method may include during a calibration phase, measuring phase and amplitude information associated with a resistive-inductive-capacitive sensor driven by a driving signal at a driving frequency and during the calibration phase and based on the phase and amplitude information, determining at least one of a resonant frequency of the resistive-inductive-capacitive sensor and a transfer function of the resistive-inductive-capacitive sensor.

In accordance with embodiments of the present disclosure, a host device may include an enclosure and a resonant phase sensing system integral to the enclosure. The resonant phase sensing system may include a resistive-inductive-capacitive sensor, a driver configured to drive the resistive-inductive-capacitive sensor with a driving signal at a driving frequency, and a measurement circuit communicatively coupled to the resistive-inductive-capacitive sensor and configured to, during a calibration phase of the measurement circuit, measure phase and amplitude information associated with the resistive-inductive-capacitive sensor and based on the phase and amplitude information, determine at least one of a resonant frequency of the resistive-inductive-capacitive sensor and a transfer function of the resistive-inductive-capacitive sensor.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
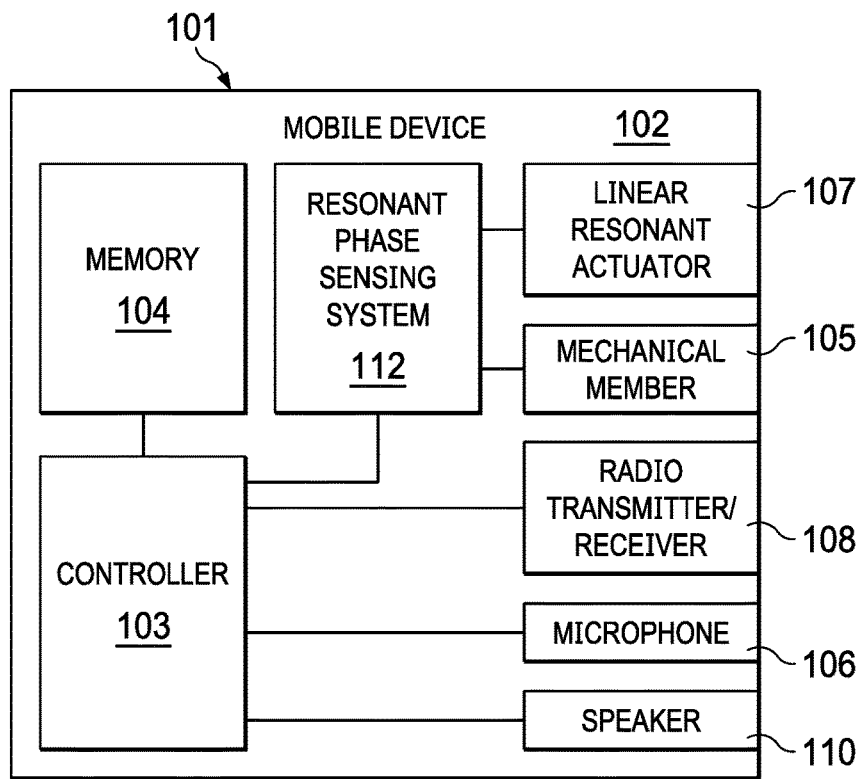
FIG. 1 illustrates a block diagram of selected components of an example mobile device, in accordance with embodiments of the present disclosure.

FIG. 1 illustrates a block diagram of selected components of an example mobile device 102, in accordance with embodiments of the present disclosure. As shown in FIG. 1, mobile device 102 may comprise an enclosure 101, a controller 103, a memory 104, a mechanical member 105, a microphone 106, a linear resonant actuator 107, a radio transmitter/receiver 108, a speaker 110, and a resonant phase sensing system 112.

Enclosure 101 may comprise any suitable housing, casing, or other enclosure for housing the various components of mobile device 102. Enclosure 101 may be constructed from plastic, metal, and/or any other suitable materials. In addition, enclosure 101 may be adapted (e.g., sized and shaped) such that mobile device 102 is readily transported on a person of a user of mobile device 102. Accordingly, mobile device 102 may include but is not limited to a smart phone, a tablet computing device, a handheld computing device, a personal digital assistant, a notebook computer, a video game controller, or any other device that may be readily transported on a person of a user of mobile device 102.

Controller 103 may be housed within enclosure 101 and may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, controller 103 may interpret and/or execute program instructions and/or process data stored in memory 104 and/or other computer-readable media accessible to controller 103.

Memory 104 may be housed within enclosure 101, may be communicatively coupled to controller 103, and may include any system, device, or apparatus configured to retain program instructions and/or data for a period of time (e.g., computer-readable media). Memory 104 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to mobile device 102 is turned off.

Microphone 106 may be housed at least partially within enclosure 101, may be communicatively coupled to controller 103, and may comprise any system, device, or apparatus configured to convert sound incident at microphone 106 to an electrical signal that may be processed by controller 103, wherein such sound is converted to an electrical signal using a diaphragm or membrane having an electrical capacitance that varies based on sonic vibrations received at the diaphragm or membrane. Microphone 106 may include an electrostatic microphone, a condenser microphone, an electret microphone, a microelectromechanical systems (MEMs) microphone, or any other suitable capacitive microphone.

Radio transmitter/receiver 108 may be housed within enclosure 101, may be communicatively coupled to controller 103, and may include any system, device, or apparatus configured to, with the aid of an antenna, generate and transmit radio-frequency signals as well as receive radio-frequency signals and convert the information carried by such received signals into a form usable by controller 103. Radio transmitter/receiver 108 may be configured to transmit and/or receive various types of radio-frequency signals, including without limitation, cellular communications (e.g., 2G, 3G, 4G, LTE, etc.), short-range wireless communications (e.g., BLUETOOTH), commercial radio signals, television signals, satellite radio signals (e.g., GPS), Wireless Fidelity, etc.

A speaker 110 may be housed at least partially within enclosure 101 or may be external to enclosure 101, may be communicatively coupled to controller 103, and may comprise any system, device, or apparatus configured to produce sound in response to electrical audio signal input. In some embodiments, a speaker may comprise a dynamic loudspeaker, which employs a lightweight diaphragm mechanically coupled to a rigid frame via a flexible suspension that constrains a voice coil to move axially through a cylindrical magnetic gap. When an electrical signal is applied to the voice coil, a magnetic field is created by the electric current in the voice coil, making it a variable electromagnet. The voice coil and the driver's magnetic system interact, generating a mechanical force that causes the voice coil (and thus, the attached cone) to move back and forth, thereby reproducing sound under the control of the applied electrical signal coming from the amplifier.

Mechanical member 105 may be housed within or upon enclosure 101, and may include any suitable system, device, or apparatus configured such that all or a portion of mechanical member 105 displaces in position responsive to a force, a pressure, or a touch applied upon or proximately to mechanical member 105. In some embodiments, mechanical member 105 may be designed to appear as a mechanical button on the exterior of enclosure 101.

Linear resonant actuator 107 may be housed within enclosure 101, and may include any suitable system, device, or apparatus for producing an oscillating mechanical force across a single axis. For example, in some embodiments, linear resonant actuator 107 may rely on an alternating current voltage to drive a voice coil pressed against a moving mass connected to a spring. When the voice coil is driven at the resonant frequency of the spring, linear resonant actuator 107 may vibrate with a perceptible force. Thus, linear resonant actuator 107 may be useful in haptic applications within a specific frequency range. While, for the purposes of clarity and exposition, this disclosure is described in relation to the use of linear resonant actuator 107, it is understood that any other type or types of vibrational actuators (e.g., eccentric rotating mass actuators) may be used in lieu of or in addition to linear resonant actuator 107. In addition, it is also understood that actuators arranged to produce an oscillating mechanical force across multiple axes may be used in lieu of or in addition to linear resonant actuator 107. As described elsewhere in this disclosure, a linear resonant actuator 107, based on a signal received from resonant phase sensing system 112, may render haptic feedback to a user of mobile device 102 for at least one of mechanical button replacement and capacitive sensor feedback.

Together, mechanical member 105 and linear resonant actuator 107 may form a human-interface device, such as a virtual interface (e.g., a virtual button), which, to a user of mobile device 102, has a look and feel of a mechanical button or other mechanical interface of mobile device 102.

Resonant phase sensing system 112 may be housed within enclosure 101, may be communicatively coupled to mechanical member 105 and linear resonant actuator 107, and may include any system, device, or apparatus configured to detect a displacement of mechanical member 105 indicative of a physical interaction (e.g., by a user of mobile device 102) with the human-machine interface of mobile device 102 (e.g., a force applied by a human finger to a virtual interface of mobile device 102). As described in greater detail below, resonant phase sensing system 112 may detect displacement of mechanical member 105 by performing resonant phase sensing of a resistive-inductive-capacitive sensor for which an impedance (e.g., inductance, capacitance, and/or resistance) of the resistive-inductive-capacitive sensor changes in response to displacement of mechanical member 105. Thus, mechanical member 105 may comprise any suitable system, device, or apparatus which all or a portion thereof may displace, and such displacement may cause a change in an impedance of a resistive-inductive-capacitive sensor integral to resonant phase sense system 112. Resonant phase sensing system 112 may also generate an electronic signal for driving linear resonant actuator 107 in response to a physical interaction associated with a human-machine interface associated with mechanical member 105. Detail of an example resonant phase sensing system 112 in accordance with embodiments of the present disclosure is depicted in greater detail below.

Although specific example components are depicted above in FIG. 1 as being integral to mobile device 102 (e.g., controller 103, memory 104, mechanical member 105, microphone 106, radio transmitter/receiver 108, speakers(s) 110, linear resonant actuator 107, etc.), a mobile device 102 in accordance with this disclosure may comprise one or more components not specifically enumerated above. For example, although FIG. 1 depicts certain user interface components, mobile device 102 may include one or more other user interface components in addition to those depicted in FIG. 1, including but not limited to a keypad, a touch screen, and a display, thus allowing a user to interact with and/or otherwise manipulate mobile device 102 and its associated components. In addition, although FIG. 1 depicts only a single virtual button comprising mechanical member 105 and linear resonant actuator 107 for purposes of clarity and exposition, in some embodiments a mobile device 102 may have multiple virtual interfaces each comprising a respective mechanical member 105 and linear resonant actuator 107.

Although, as stated above, resonant phase sensing system 112 may detect displacement of mechanical member 105 by performing resonant phase sensing of a resistive-inductive-capacitive sensor for which an impedance (e.g., inductance, capacitance, and/or resistance) of the resistive-inductive-capacitive sensor changes in response to displacement of mechanical member 105, in some embodiments resonant phase sensing system 112 may primarily detect displacement of mechanical member 105 by using resonant phase sensing to determine a change in an inductance of a resistive-inductive-capacitive sensor. For example, FIGS. 2 and 3 illustrate selected components of an example inductive sensing application that may be implemented by resonant phase sensing system 112, in accordance with embodiments of the present disclosure.

Although the foregoing contemplates a resonant phase sensing system 112 for use in a mobile device 102, the resonant phase sensing system 112 may be used in any other suitable host device. A host device may include without limitation, a portable and/or battery-powered mobile computing device (e.g., a laptop, notebook, or tablet computer), a gaming console, a remote control device, a home automation controller, a domestic appliance (e.g., domestic temperature or lighting control system), a toy, a machine (e.g., a robot) such as a robot, an audio player, a video player, and a mobile telephone (e.g., a smartphone).

Figure 2:
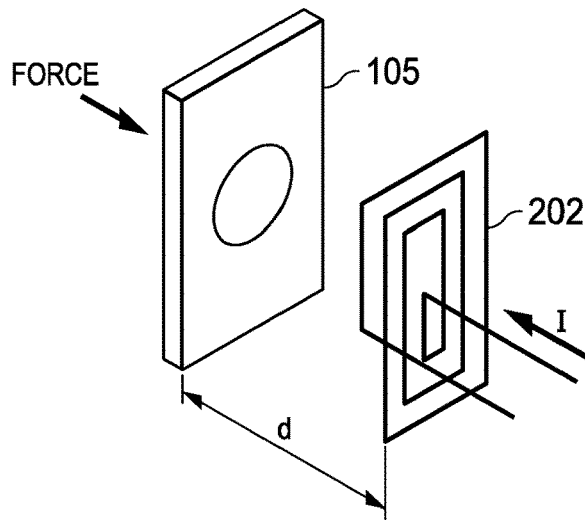
FIG. 2 illustrates a mechanical member separated by a distance from an inductive coil, in accordance with embodiments of the present disclosure.
Figure 3:
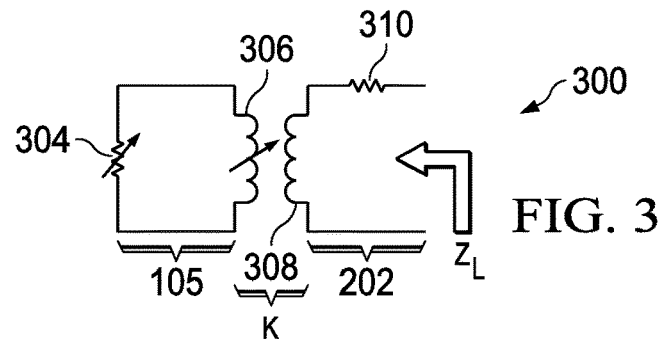
FIG. 3 illustrates selected components of a model for a mechanical member and inductive coil that may be used in an inductive sensing system, in accordance with embodiments of the present disclosure.

FIG. 2 illustrates mechanical member 105 embodied as a metal plate separated by a distance d from an inductive coil 202, in accordance with embodiments of the present disclosure. FIG. 3 illustrates selected components of a model for mechanical member 105 and inductive coil 202 that may be used in an inductive sensing system 300, in accordance with embodiments of the present disclosure. As shown in FIG. 3, inductive sensing system 300 may include mechanical member 105, modeled as a variable electrical resistance 304 and a variable electrical inductance 306, and may include inductive coil 202 in physical proximity to mechanical member 105 such that inductive coil 202 has a mutual inductance with mechanical member 105 defined by a variable coupling coefficient k. As shown in FIG. 3, inductive coil 202 may be modeled as a variable electrical inductance 308 and a variable electrical resistance 310.

In operation, as a current I flows through inductive coil 202, such current may induce a magnetic field which in turn may induce an eddy current inside mechanical member 105. When a force is applied to and/or removed from mechanical member 105, which alters distance d between mechanical member 105 and inductive coil 202, the coupling coefficient k, variable electrical resistance 304, and/or variable electrical inductance 306 may also change in response to the change in distance. These changes in the various electrical parameters may, in turn, modify an effective impedance $Z_L$ of inductive coil 202.

Figure 4:
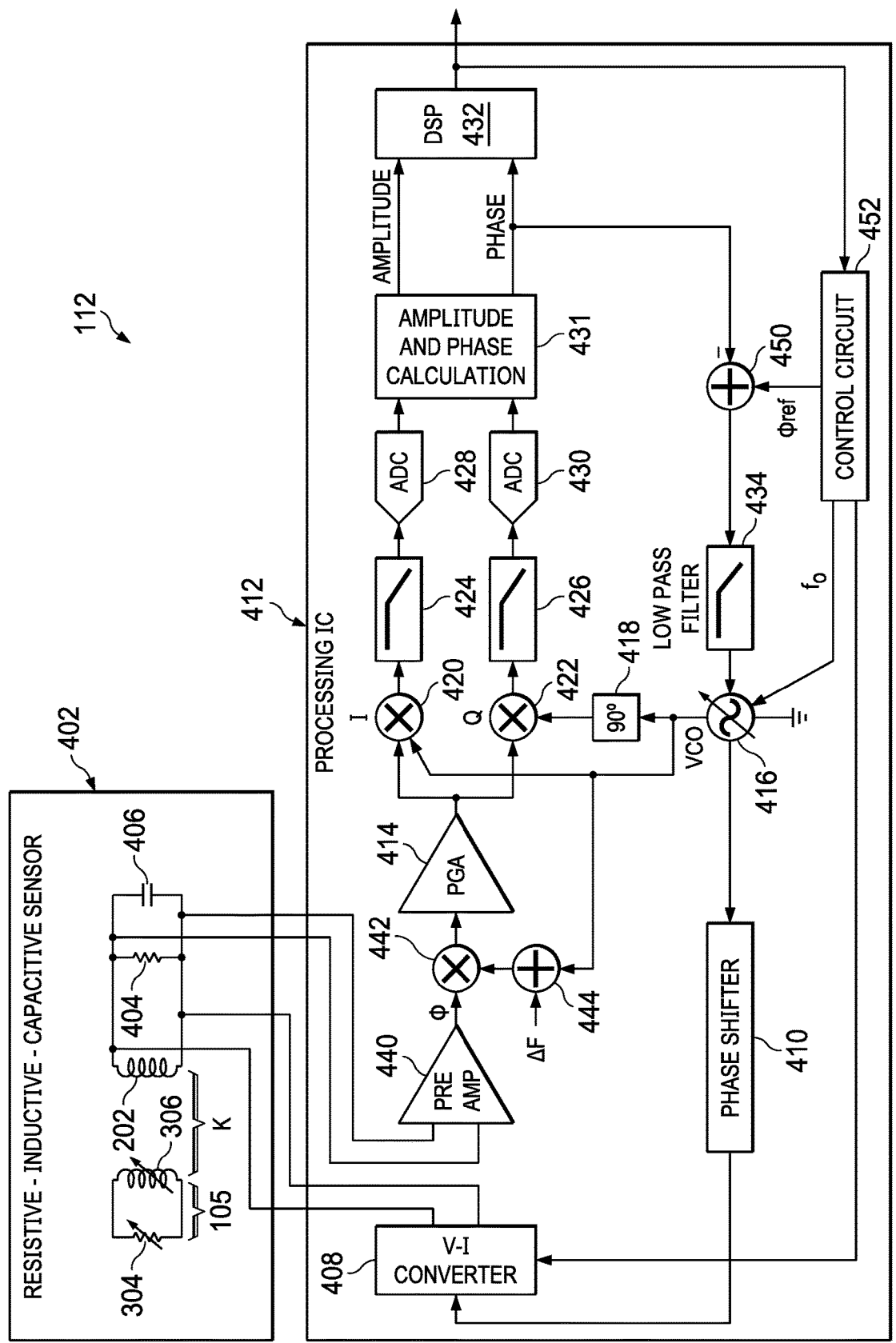
FIG. 4 illustrates a diagram of selected components of an example resonant phase sensing system, in accordance with embodiments of the present disclosure.

FIG. 4 illustrates a diagram of selected components of an example resonant phase sensing system 112, in accordance with embodiments of the present disclosure. In some embodiments, resonant phase sensing system 112 may be used to implement resonant phase sensing system 112 of FIG. 1. As shown in FIG. 4, resonant phase sensing system 112 may include a resistive-inductive-capacitive sensor 402 and a processing integrated circuit (IC) 412.

As shown in FIG. 4, resistive-inductive-capacitive sensor 402 may include mechanical member 105, inductive coil 202, a resistor 404, and capacitor 406, wherein mechanical member 105 and inductive coil 202 have a variable coupling coefficient k. Although shown in FIG. 4 to be arranged in parallel with one another, it is understood that inductive coil 202, resistor 404, and capacitor 406 may be arranged in any other suitable manner that allows resistive-inductive-capacitive sensor 402 to act as a resonant tank. For example, in some embodiments, inductive coil 202, resistor 404, and capacitor 406 may be arranged in series with one another. In some embodiments, resistor 404 may not be implemented with a stand-alone resistor, but may instead be implemented by a parasitic resistance of inductive coil 202, a parasitic resistance of capacitor 406, and/or any other suitable parasitic resistance.

Processing IC 412 may be communicatively coupled to resistive-inductive-capacitive sensor 402 and may comprise any suitable system, device, or apparatus configured to implement a measurement circuit to measure phase information associated with resistive-inductive-capacitive sensor 402 and based on the phase information, determine a displacement of mechanical member 105 relative to resistive-inductive-capacitive sensor 402. Thus, processing IC 412 may be configured to determine an occurrence of a physical interaction (e.g., press or release of a virtual button) associated with a human-machine interface associated with mechanical member 105 based on the phase information.

As shown in FIG. 4, processing IC 412 may include a phase shifter 410, a voltage-to-current converter 408, a preamplifier 440, an intermediate frequency mixer 442, a combiner 444, a programmable gain amplifier (PGA) 414, a voltage-controlled oscillator (VCO) 416, a phase shifter 418, an amplitude and phase calculation block 431, a DSP 432, a low-pass filter 434, a combiner 450, and a control circuit 452. Processing IC 412 may also include a coherent incident/quadrature detector implemented with an incident channel comprising a mixer 420, a low-pass filter 424, and an analog-to-digital converter (ADC) 428, and a quadrature channel comprising a mixer 422, a low-pass filter 426, and an ADC 430 such that processing IC 412 is configured to measure the phase information using the coherent incident/quadrature detector.

Phase shifter 410 may include any system, device, or apparatus configured to detect an oscillation signal generated by processing IC 412 (as explained in greater detail below) and phase shift such oscillation signal (e.g., by 45 degrees) such that a normal operating frequency of resonant phase sensing system 112, an incident component of a sensor signal ϕ generated by pre-amplifier 440 is approximately equal to a quadrature component of sensor signal ϕ, so as to provide common mode noise rejection by a phase detector implemented by processing IC 412, as described in greater detail below.

Voltage-to-current converter 408 may receive the phase shifted oscillation signal from phase shifter 410, which may be a voltage signal, convert the voltage signal to a corresponding current signal, and drive the current signal on resistive-inductive-capacitive sensor 402 at a driving frequency with the phase-shifted oscillation signal in order to generate sensor signal ϕ which may be processed by processing IC 412, as described in greater detail below. In some embodiments, a driving frequency of the phase-shifted oscillation signal may be selected based on a resonant frequency of resistive-inductive-capacitive sensor 402 (e.g., may be approximately equal to the resonant frequency of resistive-inductive-capacitive sensor 402).

Preamplifier 440 may receive sensor signal ϕ and condition sensor signal ϕ for frequency mixing, with mixer 442, to an intermediate frequency Δf combined by combiner 444 with an oscillation frequency $f_0$ generated by VCO 416, as described in greater detail below, wherein intermediate frequency Δf is significantly less than the oscillation frequency. In some embodiments, preamplifier 440, mixer 442, and combiner 444 may not be present, in which case PGA 414 may receive sensor signal ϕ directly from resistive-inductive-capacitive sensor 402. However, when present, preamplifier 440, mixer 442, and combiner 444 may allow for mixing sensor signal ϕ down to a lower intermediate frequency Δf which may allow for lower-bandwidth and more efficient ADCs (e.g., ADCs 428 and 430 of FIG. 4) and/or which may allow for minimization of phase and/or gain mismatches in the incident and quadrature paths of the phase detector of processing IC 412.

In operation, PGA 414 may further amplify sensor signal ϕ to condition sensor signal ϕ for processing by the coherent incident/quadrature detector. VCO 416 may generate an oscillation signal to be used as a basis for the signal driven by voltage-to-current converter 408, as well as the oscillation signals used by mixers 420 and 422 to extract incident and quadrature components of amplified sensor signal ϕ. As shown in FIG. 4, mixer 420 of the incident channel may use an unshifted version of the oscillation signal generated by VCO 416, while mixer 422 of the quadrature channel may use a 90-degree shifted version of the oscillation signal phase shifted by phase shifter 418. As mentioned above, oscillation frequency $f_0$ of the oscillation signal generated by VCO 416 may be selected based on a resonant frequency of resistive-inductive-capacitive sensor 402 (e.g., may be approximately equal to the resonant frequency of resistive-inductive-capacitive sensor 402). Accordingly, as described in greater detail below, control circuit 452 may generate a control signal indicative of oscillation frequency $f_0$ and communicate such control signal to VCO 416 in order to cause VCO 416 to generate the oscillation signal at oscillation frequency $f_0$.

In the incident channel, mixer 420 may extract the incident component of amplified sensor signal ϕ, low-pass filter 424 may filter out the oscillation signal mixed with the amplified sensor signal ϕ to generate a direct current (DC) incident component, and ADC 428 may convert such DC incident component into an equivalent incident component digital signal for processing by amplitude and phase calculation block 431. Similarly, in the quadrature channel, mixer 422 may extract the quadrature component of amplified sensor signal ϕ, low-pass filter 426 may filter out the phase-shifted oscillation signal mixed with the amplified sensor signal ϕ to generate a direct current (DC) quadrature component, and ADC 430 may convert such DC quadrature component into an equivalent quadrature component digital signal for processing by amplitude and phase calculation block 431.

Amplitude and phase calculation block 431 may include any system, device, or apparatus configured to receive phase information comprising the incident component digital signal and the quadrature component digital signal and based thereon, extract amplitude and phase information.

DSP 432 may include any system, device, or apparatus configured to interpret and/or execute program instructions and/or process data. In particular, DSP 432 may receive the phase information and the amplitude information generated by amplitude and phase calculation block 431 and based thereon, determine a displacement of mechanical member 105 relative to resistive-inductive-capacitive sensor 402, which may be indicative of an occurrence of a physical interaction (e.g., press or release of a virtual button or other interaction with a virtual interface) associated with a human-machine interface associated with mechanical member 105 based on the phase information. DSP 432 may also generate an output signal indicative of the displacement. In some embodiments, such output signal may comprise a control signal for controlling mechanical vibration of linear resonant actuator 107 in response to the displacement.

Combiner 450 may subtract the phase information generated by amplitude and phase calculation block 431 from a reference phase $\phi_{ref}$ generated by control circuit 452 in order to generate an error signal that may be received by low-pass filter 434. Low-pass filter 434 may low-pass filter the error signal, and such filtered error signal may be applied to VCO 416 to modify the frequency of the oscillation signal generated by VCO 416, in order to drive sensor signal $\phi$ towards reference phase $\phi_{ref}$. As a result, sensor signal $\phi$ may comprise a transient decaying signal in response to a "press" of a virtual button (or other interaction with a virtual interface) associated with resonant phase sensing system 112 as well as another transient decaying signal in response to a subsequent "release" of the virtual button (or other interaction with a virtual interface). Accordingly, low-pass filter 434 in connection with VCO 416 may implement a feedback control loop that may track changes in operating parameters of resonant phase sensing system 112 by modifying the driving frequency of VCO 416.

Control circuit 452 may comprise any suitable system, device, or apparatus configured to generate a control signal indicative of reference phase $\phi_{ref}$ and a control signal indicative of oscillation frequency $f_0$. As described above, control circuit 452 may set oscillation frequency $f_0$ approximately equal to the resonant frequency of resistive-inductive-capacitive sensor 402. Accordingly, control circuit 452 may be configured to determine the resonant frequency of resistive-inductive-capacitive sensor 402, either during a calibration phase during end use of resistive-inductive-capacitive sensor 402 and/or during post-manufacturing testing and characterization of resistive-inductive-capacitive sensor 402 prior to intended end use. In addition, control circuit 452 may be configured to determine a transfer function of resistive-inductive-capacitive sensor 402, as described in greater detail below.

Resonance detection of resistive-inductive-capacitive sensor 402 may be desired for a number of reasons, including without limitation a calibration during end-use operation of resistive-inductive-capacitive sensor 402 due to variance in characteristics of resistive-inductive-capacitive sensor 402 due to drift in operating temperature, changes due to component aging, changes in mechanical features of resistive-inductive-capacitive sensor 402 (e.g., air gaps, device bending, device twisting, device deformation, etc.), detection of errors, and/or presence of interfering noise (e.g., which may lead to modification of the resonant frequency of resistive-inductive-capacitive sensor 402).

Transfer function mapping of resistive-inductive-capacitive sensor 402 may also be desired for a number of reasons, including without limitation that resistive-inductive-capacitive sensors may have wide manufacturing variances. Thus, performing a transfer function mapping of resistive-inductive-capacitive sensor 402 during post-manufacturing testing and characterization of resistive-inductive-capacitive sensor 402 prior to intended end use may aid in detecting sensor characteristics on a per sensor basis, detecting defects or faults in a sensor, and determining sensor characteristics in order to establish appropriate transmit and receive signal paths in processing circuitry. Performing transfer function mapping of resistive-inductive-capacitive sensor 402 during end use may aid in determining operational health of a sensor.

Resonance detection and transfer function mapping of resistive-inductive-capacitive sensor 402 may aid in determining an optimal resistive-inductive-capacitive sensor 402 and/or processing IC 412 operating point by measuring sensor phase, phase slope, amplitude, and/or quality factor in order to, for example, maximize measurement sensitivity of resistive-inductive-capacitive sensor 402, as described in greater detail below.

Figure 5:
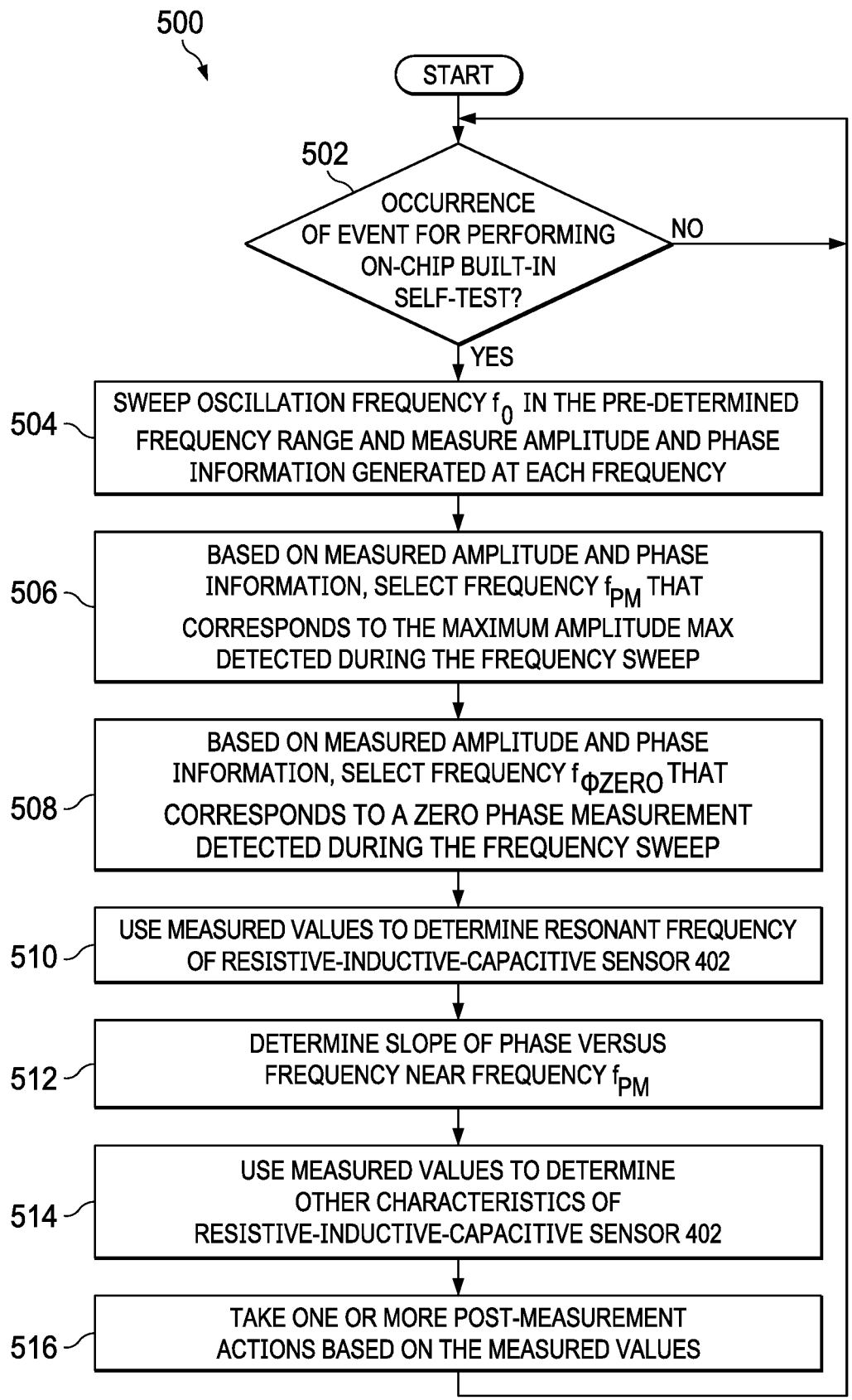
FIG. 5 illustrates a flow chart of an example method for performing an on-chip built-in self-test of a resistive-inductive-capacitor sensor, in accordance with embodiments of the present disclosure.

FIG. 5 illustrates a flow chart of an example method 500 for performing an on-chip built-in self-test of resistive-inductive-capacitor sensor 402, in accordance with embodiments of the present disclosure. According to some embodiments, method 500 may begin at step 502. As noted above, teachings of the present disclosure may be implemented in a variety of configurations of mobile device 102. As such, the preferred initialization point for method 500 and the order of the steps comprising method 500 may depend on the implementation chosen.

Figure 6:
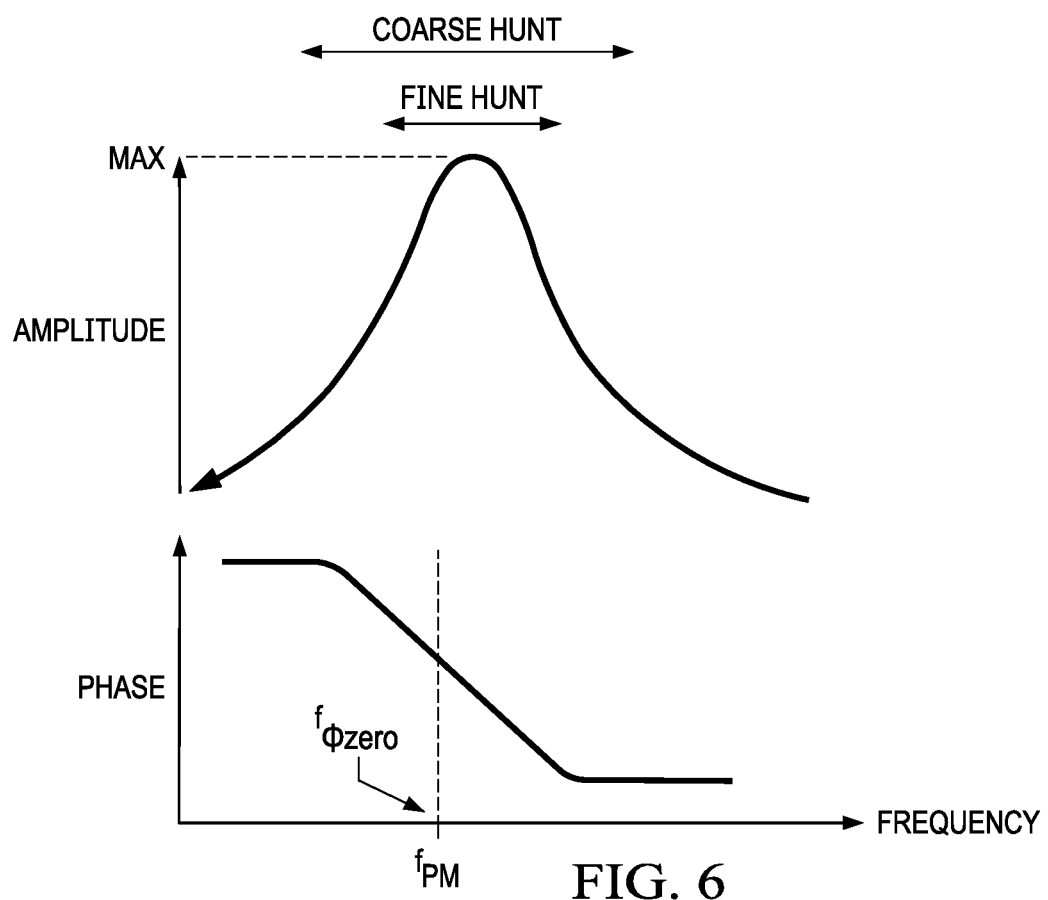
FIG. 6 illustrates an example graph depicting output amplitude and phase of a resistive-inductive-capacitive sensor obtained during an on-chip built-in self-test of the resistive-inductive-capacitor sensor, in accordance with embodiments of the present disclosure.

To further illustrate operation of method 500, FIG. 6 illustrates an example graph depicting output amplitude and phase of resistive-inductive-capacitive sensor 402 obtained during an on-chip built-in self-test of resistive-inductive-capacitive sensor 402, in accordance with embodiments of the present disclosure.

At step 502, control circuit 452 may detect an occurrence of an event or a "trigger" for performing the on-chip built-in self-test of method 500. An example of such an event may include an occurrence of an error (e.g., a phase measurement falling outside of expected bounds). Another example of such an event may include a periodic passage of time, such that the on-chip built-in self-test occurs at periodic intervals. An additional example of such an event may be the taking of a phase measurement, such that the on-chip built-in self-test is executed before each phase measurement. A further example is a measurement from another sensor of mobile device 102 falling outside a particular range (e.g., a temperature sensor, a motion sensor, and/or an optical sensor). Yet another example is a request from a host to perform the on-chip built-in self-test (e.g., a command from controller 103 of mobile device 102 and/or from a controller of a testing apparatus during testing and characterization of resonant phase sensing system 112 prior to its intended end use). Method 500 may remain at step 502 until such an event is detected. Once an event is detected, method 500 may proceed to step 504.

At step 504, control circuit 452 may sweep oscillation frequency $f_0$ in a predetermined frequency range and measure the amplitude and phase information generated by amplitude and phase calculation block 431 (e.g., as processed by DSP 432) at each frequency. In some embodiments, control circuit 452 may also control voltage-to-current converter 408 to drive the driving signal to resistive-inductive-capacitive sensor 402 at a desired amplitude. In these and other embodiments, the measurements of step 504 may be performed in a coarse phase followed by a fine phase as shown in FIG. 6: (i) in the coarse phase, control circuit 452 may sweep oscillation frequency $f_0$ across a wide frequency range (e.g., 2 Megahertz) and measure amplitude and phase information at some of the frequencies within the range; and (ii) in the fine phase, near the frequency producing the largest amplitude during the coarse phase, control circuit 452 may sweep oscillation frequency $f_0$ across a narrower range but include all discrete possible discrete frequency levels within the narrower range. In these and other embodiments, the measurements of step 504 may be repeated multiple times and averaged before method 500 proceeds to step 506, so as to reduce or eliminate the effects of noise on measurement.

At step 506, control circuit 452 may, based on processed phase and amplitude information received from DSP 432, select a frequency $f_{PM}$ that corresponds to the maximum amplitude MAX detected during the frequency sweep of step 504 and store such frequency $f_{PM}$ (e.g., in a memory integral to or otherwise accessible to control circuit 452). In some embodiments, control circuit may also record phase $\phi_{PM}$ occurring at frequency that corresponds to the maximum amplitude detected during the frequency sweep of step 504 and store such phase $\phi_{PM}$ (e.g., in a memory integral to or otherwise accessible to control circuit 452).

At step 508, control circuit 452 may, based on processed phase and amplitude information received from DSP 432, select a frequency $f_{\phi ZERO}$ that corresponds to a zero phase measurement detected during the frequency sweep of step 504 and store such frequency $f_{\phi ZERO}$ (e.g., in a memory integral to or otherwise accessible to control circuit 452). In some implementations, determination of frequency $f_{\phi ZERO}$ may be performed with resistive-inductive-capacitive sensor 402 bypassed (e.g., resistive-inductive-capacitive sensor 402 decoupled from processing IC to determine frequency $f_{\phi ZERO}$ that corresponds to a zero phase measurement).

At step 510, control circuit 452 may use frequency $f_{PM}$, phase $\phi_{PM}$, and/or frequency $f_{\phi ZERO}$ to determine a resonant frequency of resistive-inductive-capacitive sensor 402. At step 512, control circuit 452 may determine a slope of phase versus frequency near frequency $f_{PM}$ (e.g., based on two phase versus frequency measurements taken near frequency $f_{PM}$), and determine a quality factor for resistive-inductive-capacitive sensor 402 based on such phase slope.

At step 514, control circuit 452 may use frequency $f_{PM}$, phase $\phi_{PM}$, and/or frequency $f_{\phi ZERO}$ to determine other characteristics (e.g., other than resonant frequency and quality factor) of resistive-inductive-capacitive sensor 402. For example, primary and secondary resonances of resistive-inductive-capacitive sensor 402 may be determined from a plot of amplitude versus frequency. As another example, an alternating current impedance versus frequency profile may be determined from frequency $f_{PM}$, phase $\phi_{PM}$, and/or frequency $f_{\phi ZERO}$.

At step 516, control circuit 452 may take one or more post-measurement actions based on the measurements of frequency $f_{PM}$, phase $\phi_{PM}$, and/or frequency $f_{\phi ZERO}$. For example, control circuit 452 may recalibrate and generate oscillation frequency $f_0$ to the measured resonant frequency for resistive-inductive-capacitive sensor 402, thus allowing for operation at maximum efficiency and sensitivity. As a result, VCO 416 and voltage-to-current converter 408 may adjust based on a recalibrated oscillation frequency $f_0$ to drive resistive-inductive-capacitive sensor 402 at or close to its resonant frequency.

As another example of a post-measurement action, control circuit 452 may declare an error and communicate an indication of such error if a measured quality factor, measured phase slope, and/or sensor transfer function parameters of resistive-inductive-capacitive sensor 402 falls outside of a predetermined acceptable range.

A further example is that, control circuit 452 may cause filtering on measured signals for amplitude and phase to occur such that noise is reduced or eliminated in measurements taken at or near secondary resonances.

As an additional example, if the resonant frequency of resistive-inductive-capacitive sensor 402 is determined to be at a frequency susceptible to noise, control circuit 452 may vary the resonant frequency of resistive-inductive-capacitive sensor 402 (e.g., by modifying capacitance 406 of resistive-inductive-capacitive sensor 402).

After completion of step 516, method 500 may proceed again to step 502.

Although FIG. 5 discloses a particular number of steps to be taken with respect to method 500, method 500 may be executed with greater or fewer steps than those depicted in FIG. 5. In addition, although FIG. 5 discloses a certain order of steps to be taken with respect to method 500, the steps comprising method 500 may be completed in any suitable order.

Method 500 may be implemented using control circuit 452 or any other system operable to implement method 500. In certain embodiments, method 500 may be implemented partially or fully in software and/or firmware embodied in computer-readable media.

Using the method and systems disclosed herein, the measurements and transfer function mappings discussed herein are enabled as, instead of resistive-inductive-capacitive sensor 402 being part of a resonator or oscillator during the built-in self-test of control circuit 452, resistive-inductive-capacitive sensor 402 is used as a passive load impedance actively driven by a driver. The built-in self-test varies frequency (and, in some embodiments, amplitude) of the drive irrespective of sensor resonance behavior, such that both amplitude and phase information associated with resistive-inductive-capacitive sensor 402 can be measured at multiple frequencies.

Although FIG. 4 represents one or more embodiments for implementing a resonant phase sensing system 112, any other suitable resonant phase sensing system may be used consistent with this disclosure. For example, other example resonant phase sensing systems that may be used to implement resonant phase sensing system 112 are disclosed in U.S. patent application Ser. No. 16/267,079 filed Feb. 4, 2019 and entitled "Resonant Phase Sensing of Resistive-Inductive-Capacitive Sensors" and U.S. patent application Ser. No. 16/294,311 filed Mar. 6, 2019 and entitled "False Triggering Prevention in a Resonant Phase Sensing System," both of which are incorporated by reference herein in their entireties.

Although the foregoing contemplates use of closed-loop feedback for sensing of displacement, the various embodiments represented by FIG. 4 may be modified to implement an open-loop system for sensing of displacement. In such an open-loop system, a processing IC may include no feedback path from amplitude and phase calculation block 431 to VCO 416 or variable phase shifter 418 and thus may also lack a feedback low-pass filter 434. Thus, a phase measurement may still be made by comparing a change in phase to a reference phase value, but the oscillation frequency driven by VCO 416 may not be modified, or the phase shifted by variable phase shifter 418 may not be shifted.

Although the foregoing contemplates use of a coherent incident/quadrature detector as a phase detector for determining phase information associated with resistive-inductive-capacitive sensor 402, a resonant phase sensing system 112 may perform phase detection and/or otherwise determine phase information associated with resistive-inductivecapacitive sensor 402 in any suitable manner, including, without limitation, using only one of the incident path or quadrature path to determine phase information.

In some embodiments, an incident/quadrature detector as disclosed herein may include one or more frequency translation stages that translate the sensor signal into direct-current signal directly or into an intermediate frequency signal and then into a direct-current signal. Any of such frequency translation stages may be implemented either digitally after an analog-to-digital converter stage or in analog before an analog-to-digital converter stage.

In addition, although the foregoing contemplates measuring changes in resistance and inductance in resistive-inductive-capacitive sensor 402 caused by displacement of mechanical member 105, other embodiments may operate based on a principle that any change in impedance based on displacement of mechanical member 105 may be used to sense displacement. For example, in some embodiments, displacement of mechanical member 105 may cause a change in a capacitance of resistive-inductive-capacitive sensor 402, such as if mechanical member 105 included a metal plate implementing one of the capacitive plates of capacitor 406.

Although DSP 432 may be capable of processing phase information to make a binary determination of whether physical interaction associated with a human-machine interface associated with mechanical member 105 has occurred and/or ceased to occur, in some embodiments, DSP 432 may quantify a duration of a displacement of mechanical member 105 to more than one detection threshold, for example to detect different types of physical interactions (e.g., a short press of a virtual button versus a long press of the virtual button). In these and other embodiments, DSP 432 may quantify a magnitude of the displacement to more than one detection threshold, for example to detect different types of physical interactions (e.g., a light press of a virtual button versus a quick and hard press of the virtual button).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
    a resistive-inductive-capacitive sensor;
    a driver configured to drive the resistive-inductive-capacitive sensor with a driving signal at a driving frequency; and
    a measurement circuit communicatively coupled to the resistive-inductive-capacitive sensor and configured to, during a calibration phase of the measurement circuit:
        measure phase and amplitude information associated with the resistive-inductive-capacitive sensor; and
        based on the phase and amplitude information, determine at least one of a resonant frequency of the resistive-inductive-capacitive sensor and a transfer function of the resistive-inductive-capacitive sensor.

2. The system of claim 1, wherein the measurement circuit is further configured to, during the calibration phase, use at least one of the resonant frequency of the resistive-inductive-capacitive sensor and the transfer function of the resistive-inductive-capacitive sensor to monitor a health of the resistive-inductive-capacitive sensor.

3. The system of claim 1, wherein the measurement circuit is further configured to, during the calibration phase, use at least one of the resonant frequency of the resistive-inductive-capacitive sensor and the transfer function of the resistive-inductive-capacitive sensor as a basis to modify one or more operational parameters of the system.

4. The system of claim 3, wherein the one or more operational parameters comprises the driving frequency.

5. The system of claim 3, wherein the one or more operational parameters comprises the resonant frequency.

6. The system of claim 1, wherein the measurement circuit is further configured to, during the calibration phase, determine at least one of the following from the phase and amplitude information:
- a slope of phase versus frequency for the resistive-inductive-capacitive sensor;
- a quality factor of the resistive-inductive-capacitive sensor;
- a phase versus frequency profile for the resistive-inductive-capacitive sensor;
- an amplitude versus frequency profile for the resistive-inductive-capacitive sensor;
- primary and secondary resonances of the resistive-inductive-capacitive sensor;
- maximum amplitude for the resistive-inductive-capacitive sensor and a frequency at which maximum amplitude occurs; and
- an alternating impedance versus frequency profile for the resistive-inductive-capacitive sensor.

7. The system of claim 1, wherein the measurement circuit is further configured to, during the calibration phase, measure the phase and amplitude information at multiple frequencies of the driving signal.

8. The system of claim 7, wherein the measurement circuit is further configured to, during the calibration phase, measure the phase and amplitude information at multiple amplitudes of the driving signal.

9. The system of claim 1, wherein the measurement circuit is further configured to, during the calibration phase, measure the phase and amplitude information at multiple frequencies of the driving signal while bypassing the resistive-inductive-capacitive sensor from the measurement circuit.

10. The system of claim 1, wherein the measurement circuit is configured to initiate the calibration phase in response to an occurrence of an event for entering the calibration phase.

11. The system of claim 10, wherein the event comprises at least one of:
- detection of an error associated with the resistive-inductive-capacitive sensor;
- detection of a measurement of the resistive-inductive-capacitive sensor outside of expected bounds;
- passage of a periodic duration;
- measurement by the resistive-inductive-capacitive sensor to occur outside of the calibration phase;
- measurement data of one or more sensors external to resistive-inductive-capacitive sensor being outside of respective expected bounds; and
- a command to enter the calibration phase.

12. The system of claim 1, wherein the measurement circuit causes, in response to measurement of the phase and amplitude information, declaration of an error responsive to a quality factor, phase slope, or one or more parameters of the transfer function of the resistive-inductive-capacitive sensor being outside of respective expected bounds.

13. The system of claim 1, wherein the measurement circuit causes, in response to measurement of the phase and amplitude information, modification of one or more parameters of the system to reduce noise occurring at or near secondary resonances of the resistive-inductive-capacitive sensor.

14. The system of claim 1, wherein the measurement circuit is configured to, during a measurement phase of the measurement circuit:
- measure phase information associated with the resistive-inductive-capacitive sensor; and
- based on the phase information, determine displacement of a mechanical member relative to the resistive-inductive-capacitive sensor, wherein the displacement of the mechanical member causes a change in an impedance of the resistive-inductive-capacitive sensor.

15. A method comprising:
- during a calibration phase, measuring phase and amplitude information associated with a resistive-inductive-capacitive sensor driven by a driving signal at a driving frequency; and
- during the calibration phase and based on the phase and amplitude information, determining at least one of a resonant frequency of the resistive-inductive-capacitive sensor and a transfer function of the resistive-inductive-capacitive sensor.

16. The method of claim 15, further comprising, during the calibration phase, using at least one of the resonant frequency of the resistive-inductive-capacitive sensor and the transfer function of the resistive-inductive-capacitive sensor to monitor a health of the resistive-inductive-capacitive sensor.

17. The method of claim 15, further comprising, during the calibration phase, using at least one of the resonant frequency of the resistive-inductive-capacitive sensor and the transfer function of the resistive-inductive-capacitive sensor as a basis to modify one or more operational parameters of the system.

18. The method of claim 17, wherein the one or more operational parameters comprises the driving frequency.

19. The method of claim 17, wherein the one or more operational parameters comprises the resonant frequency.

20. The method of claim 15, further comprising, during the calibration phase, determining at least one of the following from the phase and amplitude information:
- a slope of phase versus frequency for the resistive-inductive-capacitive sensor;
- a quality factor of the resistive-inductive-capacitive sensor;
- a phase versus frequency profile for the resistive-inductive-capacitive sensor;
- an amplitude versus frequency profile for the resistive-inductive-capacitive sensor;
- primary and secondary resonances of the resistive-inductive-capacitive sensor;
- maximum amplitude for the resistive-inductive-capacitive sensor and a frequency at which maximum amplitude occurs; and
- an alternating impedance versus frequency profile for the resistive-inductive-capacitive sensor.

21. The method of claim 15, further comprising, during the calibration phase, measuring the phase and amplitude information at multiple frequencies of the driving signal.

22. The method of claim 21, further comprising, during the calibration phase, measuring the phase and amplitude information at multiple amplitudes of the driving signal.

23. The method of claim 15, further comprising, during the calibration phase, measuring the phase and amplitude information at multiple frequencies of the driving signal while bypassing the resistive-inductive-capacitive sensor from the measurement circuit.

24. The method of claim 15, further comprising initiating the calibration phase in response to an occurrence of an event for entering the calibration phase.

25. The method of claim 24, wherein the event comprises at least one of:
- detection of an error associated with the resistive-inductive-capacitive sensor;

detection of a measurement of the resistive-inductive-capacitive sensor outside of expected bounds;

passage of a periodic duration;

measurement by the resistive-inductive-capacitive sensor to occur outside of the calibration phase;

measurement data of one or more sensors external to resistive-inductive-capacitive sensor being outside of respective expected bounds; and a command to enter the calibration phase.

26. The method of claim 15, further comprising causing, in response to measurement of the phase and amplitude information, declaration of an error responsive to a quality factor, phase slope, or one or more parameters of the transfer function of the resistive-inductive-capacitive sensor being outside of respective expected bounds.

27. The method of claim 15, further comprising causing, in response to measurement of the phase and amplitude information, modification of one or more parameters of the system to reduce noise occurring at or near secondary resonances of the resistive-inductive-capacitive sensor.

28. The method of claim 15, further comprising, during a measurement phase of the measurement circuit:

measuring phase information associated with the resistive-inductive-capacitive sensor; and based on the phase information, determining displacement of a mechanical member relative to the resistive-inductive-capacitive sensor, wherein the displacement of the mechanical member causes a change in an impedance of the resistive-inductive-capacitive sensor.

29. A host device comprising:

an enclosure; and a resonant phase sensing system integral to the enclosure and comprising:

a resistive-inductive-capacitive sensor;

a driver configured to drive the resistive-inductive-capacitive sensor with a driving signal at a driving frequency; and a measurement circuit communicatively coupled to the resistive-inductive-capacitive sensor and configured to, during a calibration phase of the measurement circuit:

measure phase and amplitude information associated with the resistive-inductive-capacitive sensor; and based on the phase and amplitude information, determine at least one of a resonant frequency of the resistive-inductive-capacitive sensor and a transfer function of the resistive-inductive-capacitive sensor.

* * * * *